(12) United States Patent
Mizumura

(10) Patent No.: US 10,608,115 B2
(45) Date of Patent: Mar. 31, 2020

(54) LASER BEAM IRRADIATION DEVICE, THIN-FILM TRANSISTOR, AND METHOD OF MANUFACTURING THIN-FILM TRANSISTOR

(71) Applicant: V Technology Co., Ltd., Yokohama-shi (JP)

(72) Inventor: Michinobu Mizumura, Yokohama (JP)

(73) Assignee: V Technology Co., Ltd., Yokohama (JP)

( * ) Notice: Subject to any disclaimer, the term of this patent is extended or adjusted under 35 U.S.C. 154(b) by 0 days.

(21) Appl. No.: 16/251,668

(22) Filed: Jan. 18, 2019

(65) Prior Publication Data

US 2019/0157462 A1 May 23, 2019

Related U.S. Application Data

(63) Continuation of application No. PCT/JP2017/015885, filed on Apr. 20, 2017.

(30) Foreign Application Priority Data

Jul. 20, 2016 (JP) .................................. 2016-142773

(51) Int. Cl.
*H01L 29/786* (2006.01)
*H01L 21/268* (2006.01)
(Continued)

(52) U.S. Cl.
CPC .... *H01L 29/78672* (2013.01); *H01L 21/0268* (2013.01); *H01L 21/02422* (2013.01);
(Continued)

(58) Field of Classification Search
CPC ......... H01L 29/78672; H01L 29/78618; H01L 29/6675; H01L 29/04; H01L 27/1281;
(Continued)

(56) References Cited

U.S. PATENT DOCUMENTS

| | | | |
|---|---|---|---|
| 2004/0137671 A1* | 7/2004 | Kim .................... | H01L 21/2026 438/166 |
| 2009/0194769 A1* | 8/2009 | Hiramatsu .......... | H01L 21/2026 257/66 |
| 2012/0220140 A1* | 8/2012 | Kajiyama ......... | H01L 21/02532 438/795 |

FOREIGN PATENT DOCUMENTS

| | | |
|---|---|---|
| JP | 2003-297751 A | 10/2003 |
| JP | 2016-100537 A | 5/2016 |
| WO | 2016/084702 A1 | 6/2016 |

OTHER PUBLICATIONS

International Search Report dated Jul. 18, 2017 in counterpart International Application No. PCT/JP2017/015885.
(Continued)

*Primary Examiner* — Karen Kusumakar
*Assistant Examiner* — Adam S Bowen
(74) *Attorney, Agent, or Firm* — DLA Piper LLP (US)

(57) ABSTRACT

A laser beam irradiation device includes a light source that emits a laser beam; and a projection lens that irradiates a plurality of different areas of an amorphous silicon thin film attached to a thin-film transistor with the laser beam, wherein the projection lens irradiates the plurality of different areas of the amorphous silicon thin film with the laser beam such that a source electrode and a drain electrode of the thin-film transistor are connected in parallel to each other by a plurality of channel regions.

7 Claims, 9 Drawing Sheets

(51) Int. Cl.
　　　*H01L 21/02* (2006.01)
　　　*H01L 21/67* (2006.01)
　　　*H01L 27/12* (2006.01)
　　　*H01L 29/04* (2006.01)
　　　*H01L 29/66* (2006.01)

(52) U.S. Cl.
　　　CPC .. *H01L 21/02532* (2013.01); *H01L 21/02678* (2013.01); *H01L 21/02686* (2013.01); *H01L 21/02691* (2013.01); *H01L 21/268* (2013.01); *H01L 21/67115* (2013.01); *H01L 27/1281* (2013.01); *H01L 29/04* (2013.01); *H01L 29/6675* (2013.01); *H01L 29/786* (2013.01); *H01L 29/78618* (2013.01)

(58) Field of Classification Search
　　　CPC ........... H01L 21/67115; H01L 21/0268; H01L 21/02691; H01L 21/02686; H01L 21/02678; H01L 21/02532; H01L 21/02422; H01L 29/786; H01L 21/268; H01L 29/78696; H01L 21/67011; H01L 21/324; H01L 21/32055; H01S 3/0007
　　　USPC ........................................................ 257/40
　　　See application file for complete search history.

(56) References Cited

OTHER PUBLICATIONS

Notice of Reasons for Refusal dated Jan. 7, 2020, of counterpart Japanese Application No. 2016-142773, along with an English translation.

\* cited by examiner

⇐ MOVING DIRECTION OF GLASS SUBSTRATE

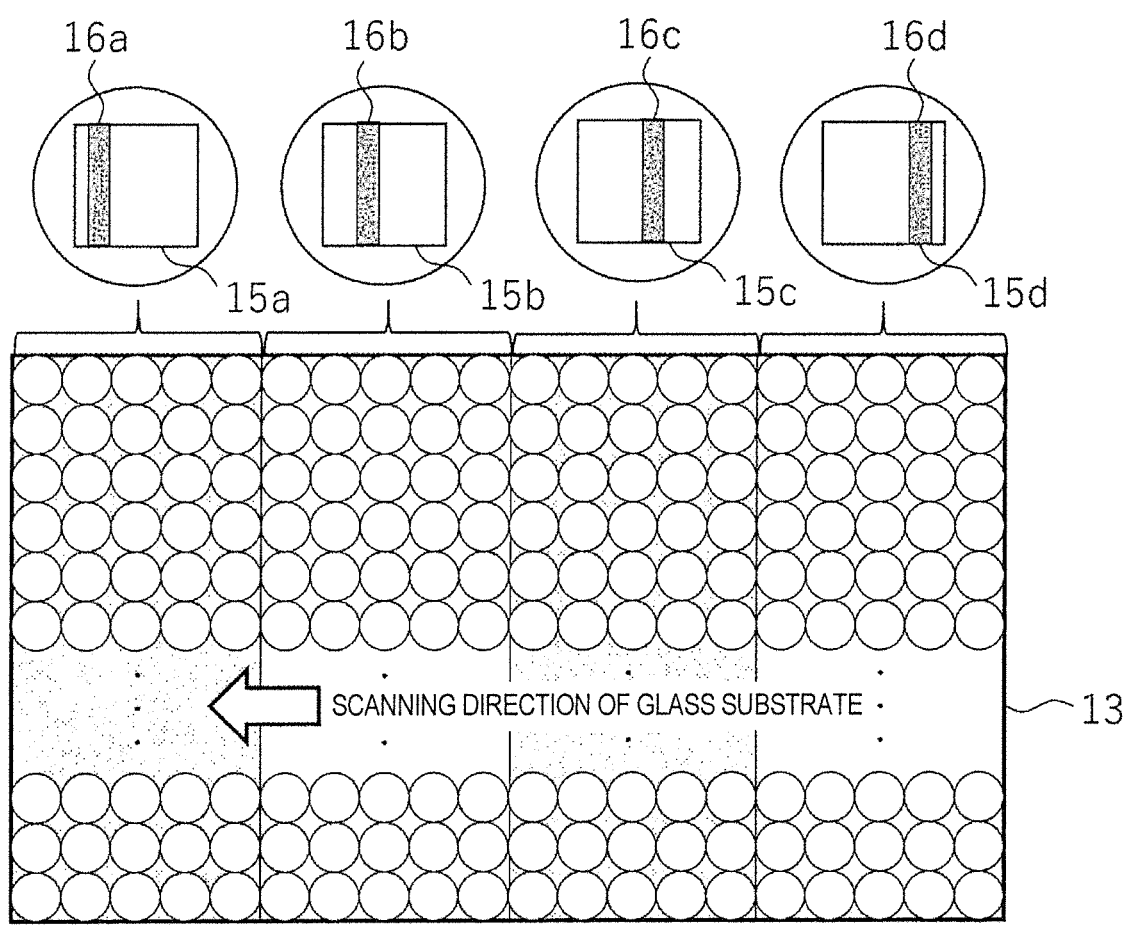

LASER BEAM IRRADIATION DEVICE, THIN-FILM TRANSISTOR, AND METHOD OF MANUFACTURING THIN-FILM TRANSISTOR

TECHNICAL FIELD

This disclosure relates to formation of a thin-film transistor and more particularly to a laser beam irradiation device that forms a polycrystalline silicon thin film by irradiating an amorphous silicon thin film on a thin-film transistor with a laser beam, a thin-film transistor, and a method of manufacturing a thin-film transistor.

BACKGROUND

A thin-film transistor with an inversely staggered structure in which an amorphous silicon thin film is used for a channel region is known. Since electron mobility of amorphous silicon thin film is small, there is a problem in that a charge mobility in a thin-film transistor is small when the amorphous silicon thin film is used for a channel region.

Therefore, techniques of poly-crystallizing a predetermined area of an amorphous silicon thin film to form a polycrystalline silicon thin film with a high electron mobility by instantaneously heating the predetermined area with a laser beam and using the polycrystalline silicon thin film for a channel region are known.

For example, Japanese Unexamined Patent Application Publication No. 2016-100537 discloses a process of forming an amorphous silicon thin film in a channel region and crystallizing the amorphous silicon thin film to a polycrystalline silicon thin film through melting and solidifying for a short time by irradiating the amorphous silicon thin film with a laser beam such as an excimer laser beam to perform laser annealing. JP '537 also describes that a channel region between a source and a drain of a thin-film transistor can be formed of a polycrystalline silicon thin film with a high electron mobility by performing this process and thus an increase in an operation speed of the transistor can be achieved.

In the thin-film transistor described in JP '537, a channel region between a source and a drain is formed of a single (one) polycrystalline silicon thin film. Accordingly, characteristics of the thin-film transistor depend on the single (one) polycrystalline silicon thin film.

Since the energy density of a laser beam such as an excimer laser beam varies depending on irradiation therewith (shots thereof), the electron mobility of the polycrystalline silicon thin film formed using the laser beam varies. Accordingly, characteristics of a thin-film transistor formed using a polycrystalline silicon thin film also depend on the variation in energy density of the laser beam.

As a result, there is a likelihood that characteristics of a plurality of thin-film transistors included in a glass substrate will vary.

It could therefore be helpful to provide a laser beam irradiation device, a thin-film transistor, and a method of manufacturing a thin-film transistor that can limit a variation in characteristics of a plurality of thin-film transistors included in a glass substrate.

Our laser beam irradiation device may include: a light source that emits a laser beam; and a projection lens that irradiates a plurality of different areas of an amorphous silicon thin film attached to a thin-film transistor with the laser beam, wherein the projection lens irradiates the plurality of different areas of the amorphous silicon thin film with the laser beam such that a source electrode and a drain electrode of the thin-film transistor are connected in parallel to each other by a plurality of channel regions.

In the laser beam irradiation device, the projection lens may perform laser annealing on the amorphous silicon thin film to form a polycrystalline silicon thin film by irradiating the plurality of different areas of the amorphous silicon thin film with the laser beam.

The projection lens may irradiate each of the plurality of different areas with the laser beam a predetermined number of times.

The projection lens may include a plurality of microlenses.

The laser beam irradiation device may further include a plurality of projection masks disposed on the plurality of microlenses and in which areas through which a laser beam is able to be transmitted are disposed to correspond to the plurality of different areas, and the plurality of microlenses may form the polycrystalline silicon thin film by irradiating the plurality of different areas of the amorphous silicon thin film with the laser beam while sequentially switching between the plurality of projection masks.

Our thin-film transistor may include: a source electrode and a drain electrode formed on a glass substrate; and a plurality of channel regions formed between the source electrode and the drain electrode, wherein the plurality of channel regions are formed of a polycrystalline silicon thin film formed by performing laser annealing on an amorphous silicon thin film, and the source electrode and the drain electrode are connected in parallel to each other by the plurality of channel regions.

The plurality of channel regions may have the same width.

Our method of manufacturing a thin-film transistor may include: a first step of forming a polycrystalline silicon thin film by irradiating a first area of an amorphous silicon thin film attached between a source electrode and a drain electrode included in a thin-film transistor with a laser beam; and a second step of forming the polycrystalline silicon thin film by irradiating a second area of the amorphous silicon thin film with the laser beam after irradiating the first area with the laser beam, wherein the second step includes irradiating the second area different from the first area in the amorphous silicon thin film with the laser beam such that the source electrode and the drain electrode are connected in parallel to each other by a plurality of amorphous silicon thin films.

The first and second steps may include forming the polycrystalline silicon thin film by irradiating the amorphous silicon thin film with the laser beam to perform laser annealing on the amorphous silicon thin film.

The first step may include irradiating the first area with the laser beam using a first microlens, and the second step may include irradiating the second area with the laser beam using a second microlens.

The first step may include irradiating the amorphous silicon thin film with the laser beam via a first projection mask in which a transmissive area corresponding to the first area is provided, and the second step may include irradiating the amorphous silicon thin film with the laser beam via a second projection mask in which a transmissive area corresponding to the second area is provided.

It is thus possible to provide a laser beam irradiation device, a thin-film transistor, and a method of manufacturing a thin-film transistor that can limit a variation in characteristics of a plurality of thin-film transistors included in a glass substrate.

BRIEF DESCRIPTION OF THE DRAWINGS

FIG. 7 is a diagram illustrating a microlens array in an example.

REFERENCE SIGNS LIST

Figure 1:
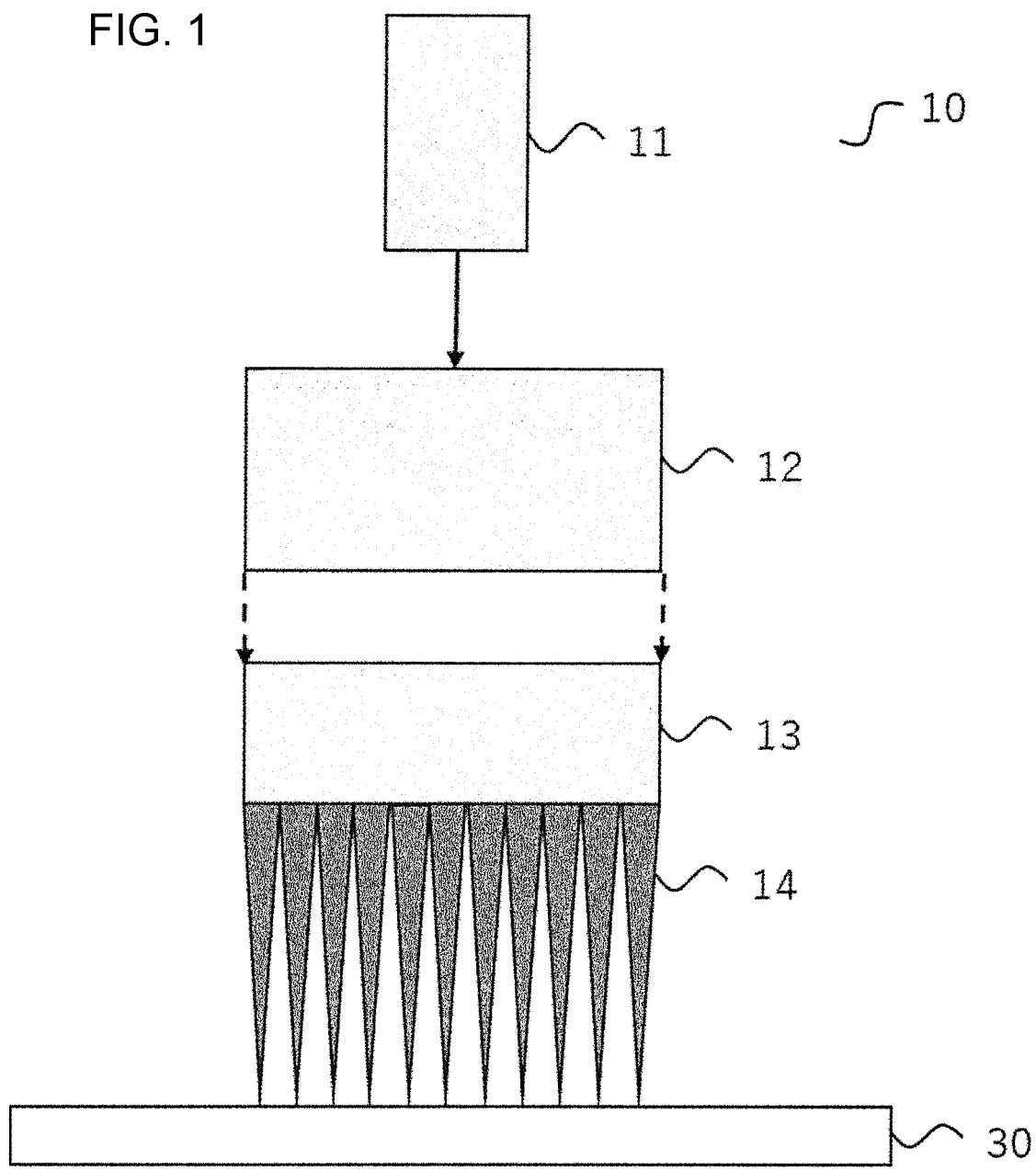
FIG. 1 is a diagram illustrating a laser beam irradiation device according to a first example.

10 Laser beam irradiation device
11 Laser beam source
12 Coupling optical system
13 Microlens array
14 Laser beam
15 Projection mask pattern
16 Transmissive area
17 Microlens
18 Projection lens
20 Thin-film transistor
21 Amorphous silicon thin film
22 Polycrystalline silicon thin film
23 Source
24 Drain
25 Area
30 Glass substrate

DETAILED DESCRIPTION

Hereinafter, various examples and configurations of our devices, transistors and methods will be specifically described with reference to the accompanying drawings.

First Example

FIG. 1 is a diagram illustrating a laser beam irradiation device 10 according to a first example.

In the first example, the laser beam irradiation device 10 is a device that is used, for example, to irradiate only an area in which a channel region is to be formed with a laser beam to anneal the channel region formation-scheduled area and poly-crystallize the channel region formation-scheduled area in a process of manufacturing a semiconductor device such as a thin-film transistor (TFT) 20.

The laser beam irradiation device 10 is used, for example, to form a thin-film transistor of a pixel in a peripheral circuit or the like of a liquid crystal display device. When such a thin-film transistor is formed, a gate electrode formed of a metal film of Al or the like is first formed in a pattern on a glass substrate 30 by sputtering. Then, a gate insulating film formed of an SiN film is formed on the entire surface of the glass substrate 30 using a low-temperature plasma CVD method. Thereafter, an amorphous silicon thin film 21 is formed on the gate insulating film, for example, using a plasma CVD method. Then, a predetermined area of the amorphous silicon thin film 21 on the gate electrode is irradiated with a laser beam 14 to perform annealing by the laser beam irradiation device 10 illustrated in FIG. 1 and the predetermined area is poly-crystallized.

As illustrated in FIG. 1, in the laser beam irradiation device 10, a beam system of a laser beam emitted from a laser beam source 11 is extended by a coupling optical system 12 and thus a luminance distribution thereof is uniform.

The laser beam source 11 is, for example, an excimer laser that radiates a laser beam with a wavelength of 308 nm or 248 nm with a predetermined repeated cycle.

Thereafter, the laser beam is separated into a plurality of laser beams 14 by a plurality of openings (transmissive areas) of a projection mask pattern 15 (not illustrated) provided on the microlens array 13 and applied to a predetermined area of the amorphous silicon thin film 21. The projection mask pattern 15 is provided on the microlens array 13 and a predetermined area is irradiated with the laser beams 14 by the projection mask pattern 15. The predetermined area of the amorphous silicon thin film 21 is instantaneously heated and melted and a part of the amorphous silicon thin film 21 becomes a polycrystalline silicon thin film 22.

The polycrystalline silicon thin film 22 has a higher electron mobility than that of the amorphous silicon thin film 21 and is used for a channel region that electrically connects a source 23 and a drain 24 in the thin-film transistor 20. In the example illustrated in FIG. 1, the microlens array 13 is used, but the microlens array 13 need not necessarily be used and the laser beams 14 may be applied using a single projection lens. In the first example, a configuration in which the polycrystalline silicon thin film 22 is formed using the microlens array 13 will be described.

FIG. 2 is a schematic diagram illustrating an example of the thin-film transistor 20 in which a predetermined area has been annealed. The thin-film transistor 20 is formed by first forming the polycrystalline silicon thin film 22 and then forming a source 23 and a drain 24 at both ends of the formed polycrystalline silicon thin film 22.

Figure 2A:
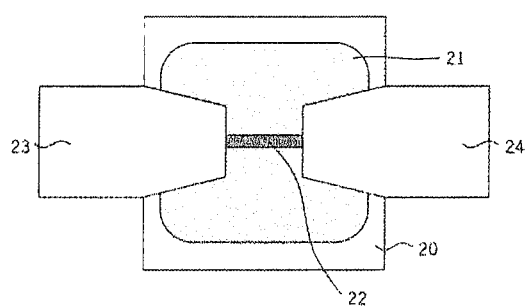
FIGS. 2A and 2B are schematic diagrams illustrating an example of a thin-film transistor in which a predetermined area has been annealed.

In the thin-film transistor illustrated in FIG. 2A, a single polycrystalline silicon thin film 22 is formed between the source 23 and the drain 24. The laser beam irradiation device 10 irradiates one thin-film transistor 20 with the laser beams 14, for example, using 20 microlenses 17 included in one column (or one row) of the microlens array 13. That is, the laser beam irradiation device 10 irradiates one thin-film transistor 20 with the laser beams 14 of 20 shots. As a result, in the thin-film transistor 20, a predetermined area of the amorphous silicon thin film 21 is instantaneously heated and melted and becomes the polycrystalline silicon thin film 22. In the laser beam irradiation device 10, the number of microlenses 17 included in one column (or one row) of the microlens array 13 is not limited to 20, and may be any number equal to or greater than two.

In an excimer laser beam, stability between pulses is about 0.5%. That is, the laser beam irradiation device 10 causes a variation of about 0.5% in the energy density of the laser beams 14 between the shots. Accordingly, there is a likelihood that a variation in the electron mobility in the polycrystalline silicon thin film 22 formed by the laser beam irradiation device 10 will be caused.

Specifically, the electron mobility in the polycrystalline silicon thin film 22 formed by applying the laser beams 14 depends on the energy density of the laser beam 14 finally applied to the polycrystalline silicon thin film 22, that is, the energy density of the final shot. As described above, the energy density of the laser beam 14 varies between the shots. That is, since the electron mobility of the polycrystalline silicon thin film 22 is determined by the laser beams 14 having a variation in the energy density, there is a likelihood that a variation in the electron mobility will be caused in the polycrystalline silicon thin films 22 included in a plurality of thin-film transistors 20 on the glass substrate 30. Since the electron mobility of the polycrystalline silicon thin films 22 determines characteristics of the thin-film transistor 20, a variation in characteristics may be caused between the plurality of thin-film transistors 20. For example, there is a likelihood that neighboring thin-film transistors 20 included in the glass substrate 30 will have a variation in characteristics thereof. When the glass substrate 30 including a plurality of thin-film transistors 20 having a variation in characteristics in this way is used for a liquid crystal of a liquid crystal display device, there is concern that display unevenness will occur.

Figure 2B:
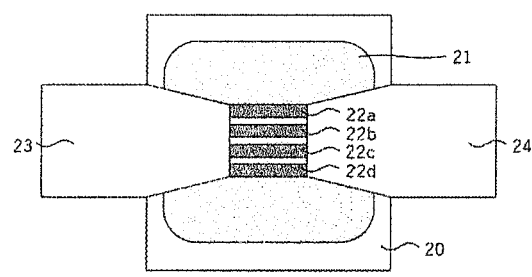

Therefore, as illustrated in FIG. 2B, in the first example, a plurality of polycrystalline silicon thin films 22 are formed and then a source 23 and a drain 24 are formed at both ends of the plurality of polycrystalline silicon thin films 22. Since the energy density of the laser beam 14 varies between the shots, there is a likelihood that a variation in the electron mobility will be caused in the plurality of polycrystalline silicon thin films 22. As described above, this is because the electron mobility of a polycrystalline silicon thin film 22 depends on the energy density of the laser beam 14 finally applied to the polycrystalline silicon thin film 22, that is, the energy density of the final shot.

Since the source 23 and the drain 24 of a thin-film transistor 20 are connected in parallel to each other by the plurality of polycrystalline silicon thin films 22, variations in the electron mobility between the plurality of polycrystalline silicon thin films 22 are averaged. For example, when four polycrystalline silicon thin films 22 are formed between the source 23 and the drain 24, there is a variation in the electron mobility between the fourth polycrystalline silicon thin films 22, but the electron mobility between the source 23 and the drain 24 has an average value of the variations in the electron mobility between the four polycrystalline silicon thin films 22.

That is, in each of the plurality of thin-film transistors 20 included in the glass substrate 30, the variations in the electron mobility between the source 23 and the drain 24 are averaged according to the number of polycrystalline silicon thin films 22 formed between the source 23 and the drain 24.

As described above, when the number of polycrystalline silicon thin films 22 between the source 23 and the drain 24 of each thin-film transistor 20 is one, the variation in characteristics between the thin-film transistors 20 depends on the variation of about 0.5% in the energy density between the shots of the laser beams 14. On the other hand, when the number of polycrystalline silicon thin films 22 between the source 23 and the drain 24 of each thin-film transistor 20 is two or more, the electron mobility of each of the plurality of polycrystalline silicon thin films 22 depends on the variation of about 0.5% in the energy density between the shots of the laser beams 14, but the variation in the electron mobility between the source 23 and the drain 24 is an average value of the variations between the plurality of polycrystalline silicon thin films 22. Accordingly, the variation in characteristics between the thin-film transistors 20 is less when the number of polycrystalline silicon thin films 22 between the source 23 and the drain 24 is two or more than when the number of polycrystalline silicon thin films 22 is one. As a result, in the first example, it is possible to decrease the variation in characteristics between the plurality of thin-film transistors 20 and suppress display unevenness in a liquid crystal of a liquid crystal display device.

In FIG. 2B, the thin-film transistor 20 and a plurality of polycrystalline silicon thin films 22 are formed between the source 23 and the drain 24. In the example illustrated in FIG. 2B, four polycrystalline silicon thin films 22 are formed between the source 23 and the drain 24. In the first example, the number of polycrystalline silicon thin films 22 between the source 23 and the drain 24 is not limited to four and may be two or more.

Each polycrystalline silicon thin film 22 has a width of, for example, 4 μm. The width of the each polycrystalline silicon thin film 22 is not limited to 4 μm and may be, for example, 7 μm. The width of each polycrystalline silicon thin film 22 is determined in consideration of an electron mobility or an OFF current. For example, when the width of a polycrystalline silicon thin film 22 increases, the electron mobility thereof increases and the magnitude of the OFF current thereof cannot be ignored. Accordingly, the width of each polycrystalline silicon thin film 22 is determined in consideration of the required characteristics of the thin-film transistor 20. The width of each polycrystalline silicon thin film 22 may be determined in consideration of the number of polycrystalline silicon thin films 22 formed in the thin-film transistor 20. The width or the number of the polycrystalline silicon thin films 22 may be determined on the basis of the size of the thin-film transistor 20. In the example illustrated in FIG. 2B, the widths of the polycrystalline silicon thin films 22 may be the same or may be different from each other.

The width of each polycrystalline silicon thin film 22 can be a predetermined width and can be preferably set to a width at which the polycrystalline silicon thin films 22 are not affected by each other. The width of each polycrystalline silicon thin film 22 may be determined on the basis of the number or the width of the polycrystalline silicon thin films 22 formed in the thin-film transistor 20 or the size of the thin-film transistor 20.

Each polycrystalline silicon thin film 22 is formed, for example, by irradiation with a laser beam 14 of five shots using the microlenses 17 included in the microlens array 13 of the laser beam irradiation device 10. As described above, the electron mobility of each polycrystalline silicon thin film 22 depends on the final shot of the laser beam 14. Accordingly, the electron mobility of each of the four polycrystalline silicon thin films 22 depends on the variation of about 0.5% in the energy density between the shots of the laser beams 14.

As illustrated in FIG. 2B, since the source 23 and the drain 24 are connected in parallel to each other by a plurality of polycrystalline silicon thin films 22, the variations between the shots are averaged. Accordingly, the variations in characteristics between the thin-film transistors 20 are also averaged. As a result, it is possible to prevent display unevenness in a liquid crystal of a liquid crystal display device.

The total size of a thin-film transistor 20 may be changed depending on the number of polycrystalline silicon thin films 22 formed in the thin-film transistor 20. For example, when the number of polycrystalline silicon thin films 22 formed is large, the size of the thin-film transistor 20 may be accordingly increased.

Figure 3:
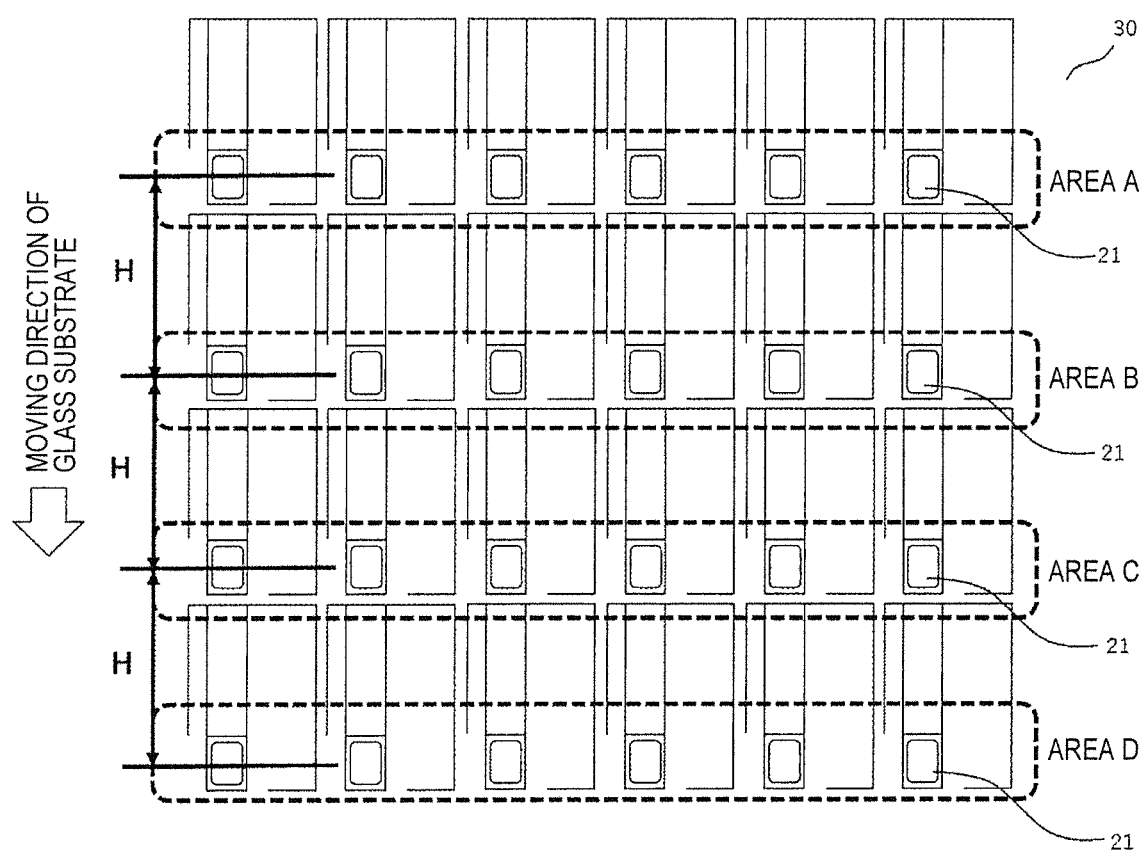
FIG. 3 is a schematic diagram illustrating an example of a glass substrate irradiated with a laser beam by the laser beam irradiation device.
Figure 4A:
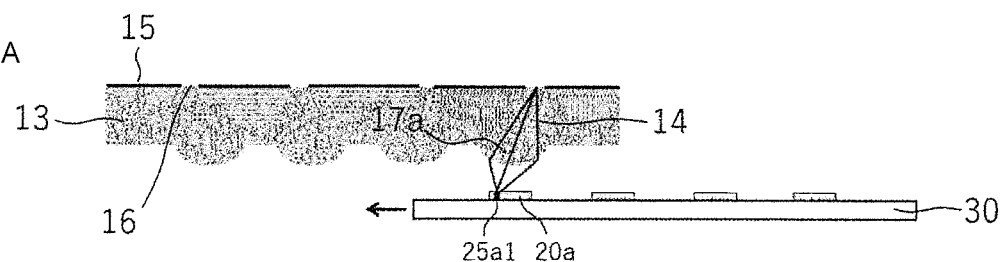
FIGS. 4A-4D are diagrams illustrating laser annealing using the laser beam irradiation device according to the example.
Figure 4B:
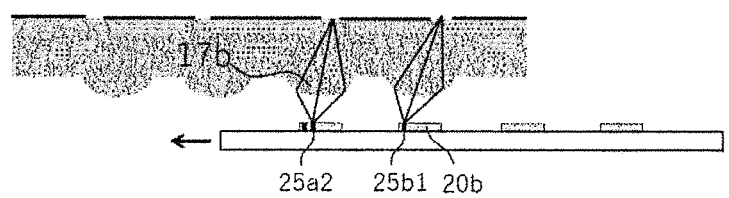
Figure 4C:
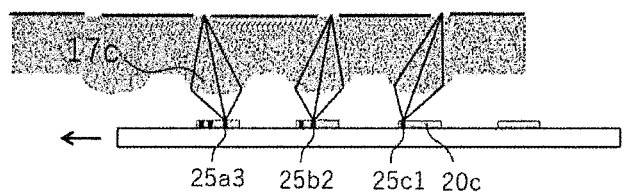
Figure 4D:
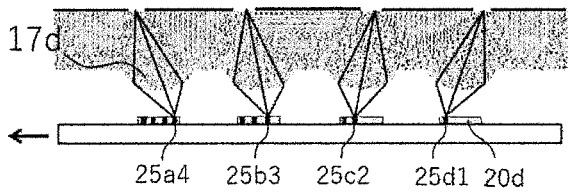

FIG. 3 is a schematic diagram illustrating an example of a glass substrate 30 irradiated with a laser beam 14 by the laser beam irradiation device 10. As illustrated in FIG. 3, the glass substrate 30 includes a plurality of pixels 31 and each pixel 31 is provided with a thin-film transistor 20. The thin-film transistor 20 performs control of light transmission in each of the plurality of pixels 31 by being electrically turned on and off.

As illustrated in FIG. 3, amorphous silicon thin films 21 are formed at predetermined intervals "H" on the glass substrate 30. A part of each amorphous silicon thin film 21 is a part that becomes a thin-film transistor 20.

The laser beam irradiation device 10 irradiates a predetermined area of the amorphous silicon thin film 21 with a laser beam 14. The laser beam irradiation device 10 irradiates the area with a laser beam 14 with a predetermined cycle, moves the glass substrate 30 while no laser beam 14 is being emitted, and irradiates a part of a next amorphous silicon thin film 21 with the laser beam 14. As illustrated in FIG. 3, the amorphous silicon thin films 21 are arranged on the glass substrate 30 at predetermined intervals "H" in the moving direction thereof. The laser beam irradiation device 10 irradiates parts of the amorphous silicon thin films 21 arranged on the glass substrate 30 with the laser beams 14 with a predetermined cycle.

First, the laser beam irradiation device 10 irradiates a plurality of amorphous silicon thin films 21 in area A of FIG. 3 with the laser beams 14 using a first microlens 17a included in the microlens array 13. Thereafter, the glass substrate 30 is moved a predetermined interval "H." While the glass substrate 30 is being moved, the laser beam irradiation device 10 stops irradiation with the laser beam 14. Then, after the glass substrate 30 has been moved "H," the laser beam irradiation device 10 irradiates a plurality of amorphous silicon thin films 21 in area B of FIG. 3 with the laser beams 14 using a second microlens 17b included in the microlens array 13. In this example, the plurality of amorphous silicon thin films 21 in area A of FIG. 3 are irradiated with the laser beams 14 using the second microlens 17b adjacent to the first microlens 17a in the microlens array 13. In this way, the amorphous silicon thin films 21 included in the glass substrate 30 are irradiated with the laser beams 14 using a plurality of microlenses 17 corresponding to one column (or one row) of the microlens array 13.

The laser beam irradiation device 10 may irradiate the glass substrate 30 which has stopped temporarily after the glass substrate 30 has been moved "H," or may irradiate the glass substrate 30 that is moving with the laser beams 14.

FIG. 4 is a diagram illustrating an example of laser annealing using the laser beam irradiation device 10 according to the first example. In the example illustrated in FIG. 4, the microlens array 13 includes four microlenses 17 in one column (or one row). The number of microlenses 17 included in one column (or one row) of the microlens array 13 is not limited to four and may be any number.

First, the laser beam irradiation device 10 irradiates a first area 25a1 of a first thin-film transistor 20a with a laser beam 14 using a microlens 17a included in the microlens array 13.

As a result, the amorphous silicon thin film 21 in the first area 25a1 is instantaneously heated and melted and a polycrystalline silicon thin film 22 is formed. The amorphous silicon thin film 21 may be formed in the entire thin-film transistor 20 or may be formed on the entire surface of the glass substrate 30.

Then, while the laser beam irradiation device 10 stops irradiation with the laser beam 14, the glass substrate 30 is moved at a predetermined interval, that is, "H" in the example illustrated in FIG. 2. Then, the laser beam irradiation device 10 irradiates a second area 25a2 of the first thin-film transistor 20a with the laser beam 14 using a microlens 17b included in the microlens array 13 to form a polycrystalline silicon thin film 22. At the same time, the laser beam irradiation device 10 irradiates the first area 25a1 of the second thin-film transistor 20b with the laser beam 14 using the microlens 17a included in the microlens array 13 to form a polycrystalline silicon thin film 22. In this example, as described above, the glass substrate 30 may continue to be moved or may be temporarily stopped only when being irradiated with the laser beam 14.

Subsequently, while the laser beam irradiation device 10 stops irradiation with the laser beam 14, the glass substrate 30 is moved at a predetermined interval. Then, the laser beam irradiation device 10 irradiates a third area 25a3 of the first thin-film transistor 20a with the laser beam 14 using a microlens 17c to form a polycrystalline silicon thin film 22. At the same time, the laser beam irradiation device 10 irradiates the second area 25b2 of the second thin-film transistor 20b with the laser beam 14 using the microlens 17b and irradiates a first area 25c1 of the third thin-film transistor 20c with the laser beam 14 using the microlens 17a to form polycrystalline silicon thin films 22.

After the glass substrate 30 has been moved by interval "H," the laser beam irradiation device 10 irradiates a fourth area 25a4 of the first thin-film transistor 20a with the laser beam 14 using a microlens 17d, irradiates a third area 25b3 of the second thin-film transistor 20b with the laser beam 14 using a microlens 17c, irradiates a second area 25c2 of the third thin-film transistor 20c with the laser beam 14 using the microlens 17b, and irradiates a first area 25d1 of a fourth thin-film transistor 20d with the laser beam 14 using the microlens 17a, to form polycrystalline silicon thin films 22.

As described above, the laser beam irradiation device 10 irradiates a predetermined area of a thin-film transistor 20 with the laser beam 14 sequentially using a plurality of microlenses 17 included in the microlens array 13 to form a polycrystalline silicon thin film 22 in the predetermined area. Since the areas irradiated using the plurality of microlenses 17 are different, the polycrystalline silicon thin films 22 can be formed in a plurality of areas of the thin-film transistor 20.

In the example illustrated in FIG. 4, the number of microlenses 17 included in one column (or one row) of the microlens array 13 is four, but is not limited to four and may be, for example, 20. When the number of microlenses 17 included in one column (or one row) of the microlens array 13 is 20, a first area (for example, 25a1) is irradiated with the laser beam 14 using initial five (first to fifth) microlenses, a second area (for example, 25a2) is irradiated with the laser beam 14 using next five (sixth to tenth) microlenses, a third area (for example, 25a3) is irradiated with the laser beam 14 using next five (eleventh to fifteenth) microlenses, and a fourth area (for example, 25a4) is irradiated with the laser beam 14 using final five (sixteenth to twentieth) microlenses. As a result, one area (each of the first to fourth areas) is irradiated with the laser beam 14 of five shots.

FIG. 5 is a schematic diagram illustrating an example of a configuration of a projection mask pattern 15 disposed on the microlens array 13. As illustrated in FIG. 5, in the first example, a plurality of polycrystalline silicon thin films 22 are formed on a thin-film transistor 20 using a plurality of projection mask patterns 15.

At least one microlens 17 is assigned to each of the plurality of projection mask patterns 15.

The laser beam irradiation device 10 performs irradiation with the laser beam 14 using the microlens 17 assigned to one projection mask pattern 15. When four projection mask patterns 15 are used as in the example illustrated in FIG. 5, for example, five microlenses 17 are assigned to each projection mask pattern 15. The number of microlenses 17 assigned to one projection mask pattern 15 may be any number. The numbers of microlenses 17 assigned to different projection mask patterns may be the same or may be different from each other.

The plurality of projection mask patterns 15 illustrated in FIG. 5 include a transmissive area 16. The laser beam 14 is transmitted by the transmissive area 16 and projected to an amorphous silicon thin film 21 on a thin-film transistor 20. The plurality of projection mask patterns 15 correspond to polycrystalline silicon thin films 22 formed on the thin-film transistor 20, and the width of the transmissive area 16 in each projection mask pattern 15 is, for example, 4 μm. The widths of the transmissive areas 16 in the projection mask patterns 15 may be the same or may be different from each other.

When the laser beam irradiation device 10 irradiates one thin-film transistor 20 with the laser beam 14 using a plurality of microlenses 17, each of the plurality of projection mask patterns 15 is assigned to at least one of the plurality of microlenses 17. When four projection mask patterns 15 are used and the laser beam irradiation device 10 irradiates one thin-film transistor 20 with the laser beam 14 using 20 microlenses 17, five microlenses 17 are assigned to one projection mask pattern 15. As a result, the laser beam irradiation device 10 irradiates the thin-film transistor 20 with the laser beam 14 of five shots using one projection mask pattern 15. As a result, a predetermined area of the amorphous silicon thin film 21 on the thin-film transistor 20 is irradiated with the laser beam 14 of five shots using one projection mask pattern 15. As a result, four polycrystalline silicon thin films 22 are formed at four positions on the thin-film transistor 20.

In the example illustrated in FIG. 5, the transmissive areas 16 of the projection mask patterns 15 are provided to be perpendicular to a moving direction (a scanning direction) of the glass substrate 30. The transmissive areas 16 of the projection mask patterns 15 do not necessarily need to be perpendicular to the moving direction (the scanning direction) of the glass substrate 30 and may be provided to be parallel (substantially parallel) to the moving direction (the scanning direction).

FIG. 6 is a schematic diagram illustrating another example of a configuration of the projection mask pattern 15 disposed on the microlens array 13. As illustrated in FIG. 6, the transmissive areas 16 of the projection mask patterns 15 may be provided to be parallel (substantially parallel) to the moving direction (the scanning direction) of the glass substrate 30.

FIG. 7 is a diagram illustrating an example of a configuration of a microlens array 13 in the first example. As illustrated in FIG. 7, 20 microlenses 17 are included in one column (or one row) in the scanning direction of the microlens array 13. The number of microlenses 17 included in the microlens array 13 may be any number.

As illustrated in FIG. 7, one of the projection mask patterns illustrated in FIG. 6 is assigned to each of the plurality of microlenses 17. In the example illustrated in FIG. 7, a projection mask pattern 15a including a transmissive area 16a is assigned to the initial first to fifth microlenses 17 in the scanning direction. A projection mask pattern 15b including a transmissive area 16b is assigned to the next sixth to tenth microlenses 17. A projection mask pattern 15c including a transmissive area 16c is assigned to the eleventh to fifteenth microlenses 17. Finally, a projection mask pattern 15d including a transmissive area 16d is assigned to the sixteenth to twentieth microlenses 17.

The number of microlenses 17 assigned to one projection mask pattern 15 may be any number. The same number of microlenses 17 may be assigned to the projection mask patterns 15 or different numbers of microlenses 17 may be assigned thereto. The projection mask patterns 15 may be randomly assigned to the microlenses 17 instead of assigning the projection mask patterns 15 thereto sequentially in the scanning direction as illustrated in FIG. 7. For example, the microlenses may be randomly assigned to the projection mask pattern 15a such as first, sixth, eighth, tenth, and fifteenth microlenses in the scanning direction.

The laser beam irradiation device 10 according to the first example irradiates a plurality of areas of a thin-film transistor 20 with the laser beam 14 using a plurality of microlenses 17 to which different projection mask patterns 15 are assigned to form polycrystalline silicon thin films 22 as illustrated in FIG. 7.

FIG. 8 is a schematic diagram illustrating an example of polycrystalline silicon thin films 22 formed in a thin-film transistor 20. As illustrated in FIG. 8, a plurality of polycrystalline silicon thin films 22 are sequentially formed in the thin-film transistor 20 using a plurality of projection mask patterns 15 illustrated in FIG. 6.

Figure 5A:
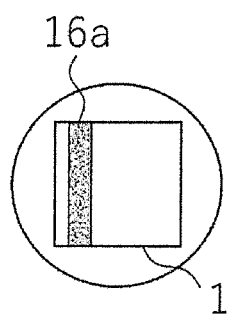
FIGS. 5A-5D are schematic diagrams illustrating an example of a configuration of a projection mask pattern disposed on a microlens array.
Figure 8A:
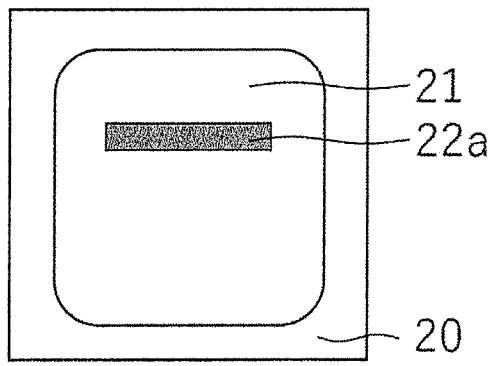
FIGS. 8A-8D are schematic diagrams illustrating an example of a polycrystalline silicon thin film formed in a thin-film transistor.
Figure 8B:
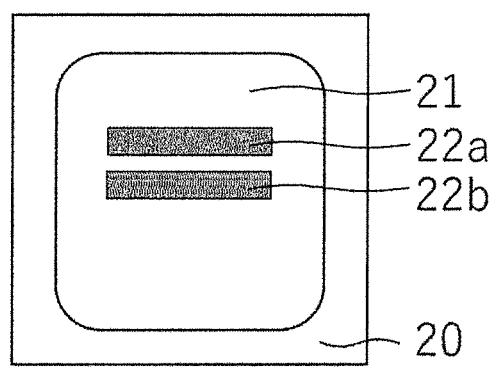
Figure 8C:
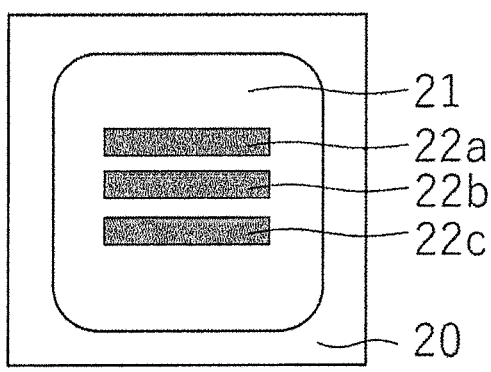
Figure 8D:
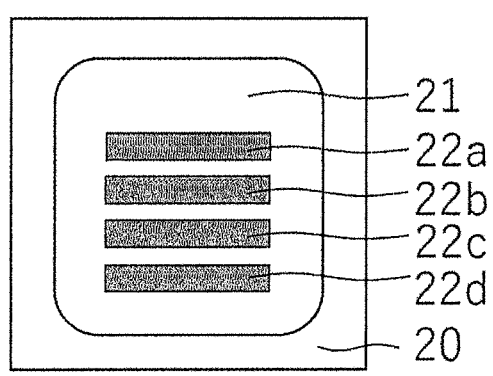

First, a polycrystalline silicon thin film 22a in FIG. 8A is formed using the microlens 17 assigned to the projection mask pattern 15 illustrated in FIG. 5A. The laser beam irradiation device 10 performs irradiation with the laser beam 14 of five shots, for example, using five microlenses 17 assigned to the projection mask pattern 15a. Thereafter, irradiation with the laser beam 14 of five shots is performed using five microlenses 17 assigned to the projection mask pattern 15b in FIG. 5B and a polycrystalline silicon thin film 22b in FIG. 8B is formed. Similarly, a polycrystalline silicon thin film 22c in FIG. 8C is formed using the microlenses 17 assigned to the projection mask pattern 15c in FIG. 5C, and a polycrystalline silicon thin film 22d in FIG. 8D is formed using the microlenses 17 assigned to the projection mask pattern 15d in FIG. 5D.

As described above, by assigning one or more microlenses 17 to each of a plurality of projection mask patterns 15 in the laser beam irradiation device 10, the polycrystalline silicon thin films 22 can be formed in a plurality of areas of the thin-film transistor 20.

In this way, in the first example, a plurality of polycrystalline silicon thin films 22 can be formed between the source 23 and the drain 24 of the thin-film transistor 20 by assigning the microlenses 17 to the plurality of projection mask patterns 15. The plurality of polycrystalline silicon thin films 22 are used for a channel region for electrical connection.

A method of manufacturing a thin-film transistor 20 according to the first example illustrated in FIG. 2 using the laser beam irradiation device 10 will be described below.

In a first step, the laser beam irradiation device 10 irradiates a first area of a thin-film transistor 20 with a laser beam 14 using the microlenses 17 assigned to the projection mask pattern 15a in FIG. 5A. As a result, the amorphous silicon thin film 21 in the first area of the thin-film transistor 20 is instantaneously heated and melted and the polycrystalline silicon thin film 22a in FIG. 8A is formed. The laser beam irradiation device 10 irradiates the first area with the laser beam 14 of five shots, for example, using five microlenses 17 assigned to the projection mask pattern 15a.

Figure 5B:
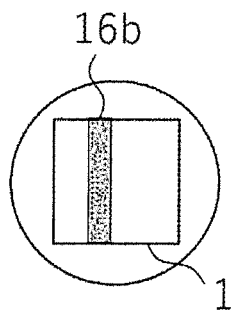

Subsequently, in a second step, the laser beam irradiation device 10 irradiates a second area of the thin-film transistor 20 with a laser beam 14 using the microlenses 17 assigned to the projection mask pattern 15b in FIG. 5B. As a result, the amorphous silicon thin film 21 in the second area of the thin-film transistor 20 is instantaneously heated and melted and the polycrystalline silicon thin film 22b in FIG. 8B is formed. The laser beam irradiation device 10 irradiates the second area with the laser beam 14 of five shots, for example, using five microlenses 17 assigned to the projection mask pattern 15b.

Figure 5C:
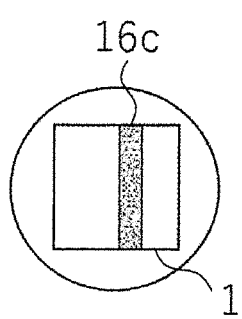

Similarly, in a third step, the laser beam irradiation device 10 irradiates a third predetermined area of the thin-film transistor 20 with a laser beam 14 using the microlenses 17 assigned to the projection mask pattern 15c in FIG. 5C. As a result, the amorphous silicon thin film 21 in the third area of the thin-film transistor 20 is instantaneously heated and melted and the polycrystalline silicon thin film 22c in FIG. 8C is formed. The laser beam irradiation device 10 irradiates the third area with the laser beam 14 of five shots, for example, using five microlenses 17 assigned to the projection mask pattern 15c.

Figure 5D:
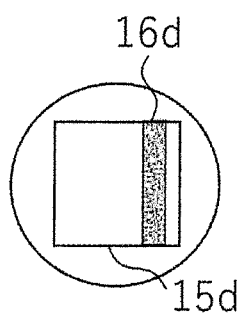
Figure 6A:
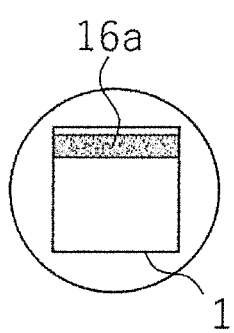
FIGS. 6A-6D are schematic diagrams illustrating another example of a configuration of the projection mask pattern disposed on the microlens array.
Figure 6B:
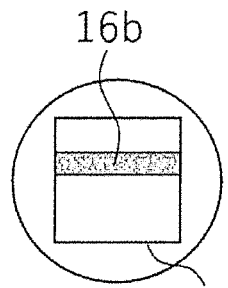
Figure 6C:
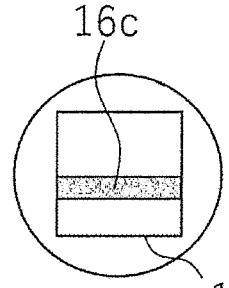
Figure 6D:
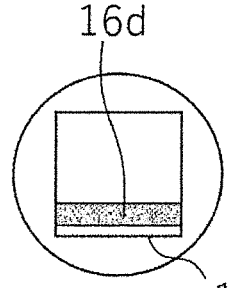

Subsequently, in a fourth step, the laser beam irradiation device 10 irradiates a fourth area of the thin-film transistor 20 with a laser beam 14 using the microlenses 17 assigned to the projection mask pattern 15d in FIG. 5D. As a result, the amorphous silicon thin film 21 in the fourth area of the thin-film transistor 20 is instantaneously heated and melted and the polycrystalline silicon thin film 22d in FIG. 8D is formed. The laser beam irradiation device 10 irradiates the fourth area with the laser beam 14 of five shots, for example, using five microlenses 17 assigned to the projection mask pattern 15d.

The glass substrate 30 is moved a predetermined distance whenever irradiation with the laser beam 14 is performed using one microlens 17. The predetermined distance is a distance "H" between a plurality of thin-film transistors 20 in the glass substrate 30 as illustrated in FIG. 2. The laser beam irradiation device 10 stops irradiation with a laser beam 14 while the glass substrate 30 is being moved the predetermined distance.

After the glass substrate 30 has been moved the predetermined distance "H," the laser beam irradiation device 10 performs irradiation with a laser beam 14 using the microlenses 17 included in the microlens array 13.

After a polycrystalline silicon thin film 22 is formed in a predetermined area of the thin-film transistor 20 of the glass substrate 30 using laser annealing, the source 23 and the drain 24 are formed in the thin-film transistor 20 in another step.

In this way, in the first example, a plurality of polycrystalline silicon thin films 22 are formed on a thin-film transistor 20 using a plurality of projection mask patterns 15. As a result, the electron mobility between the source 23 and the drain 24 in each of a plurality of thin-film transistors 20 included in the glass substrate 30 has a value obtained by averaging the variations in the electron mobility. Accordingly, in the first example, since variations in characteristics between the plurality of thin-film transistors 20 are reduced, it is possible to prevent display unevenness in a liquid crystal of a liquid crystal display device.

Second Example

A second example is a configuration in which laser annealing is performed using one projection lens 18 instead of the microlens array 13.

Figure 9:
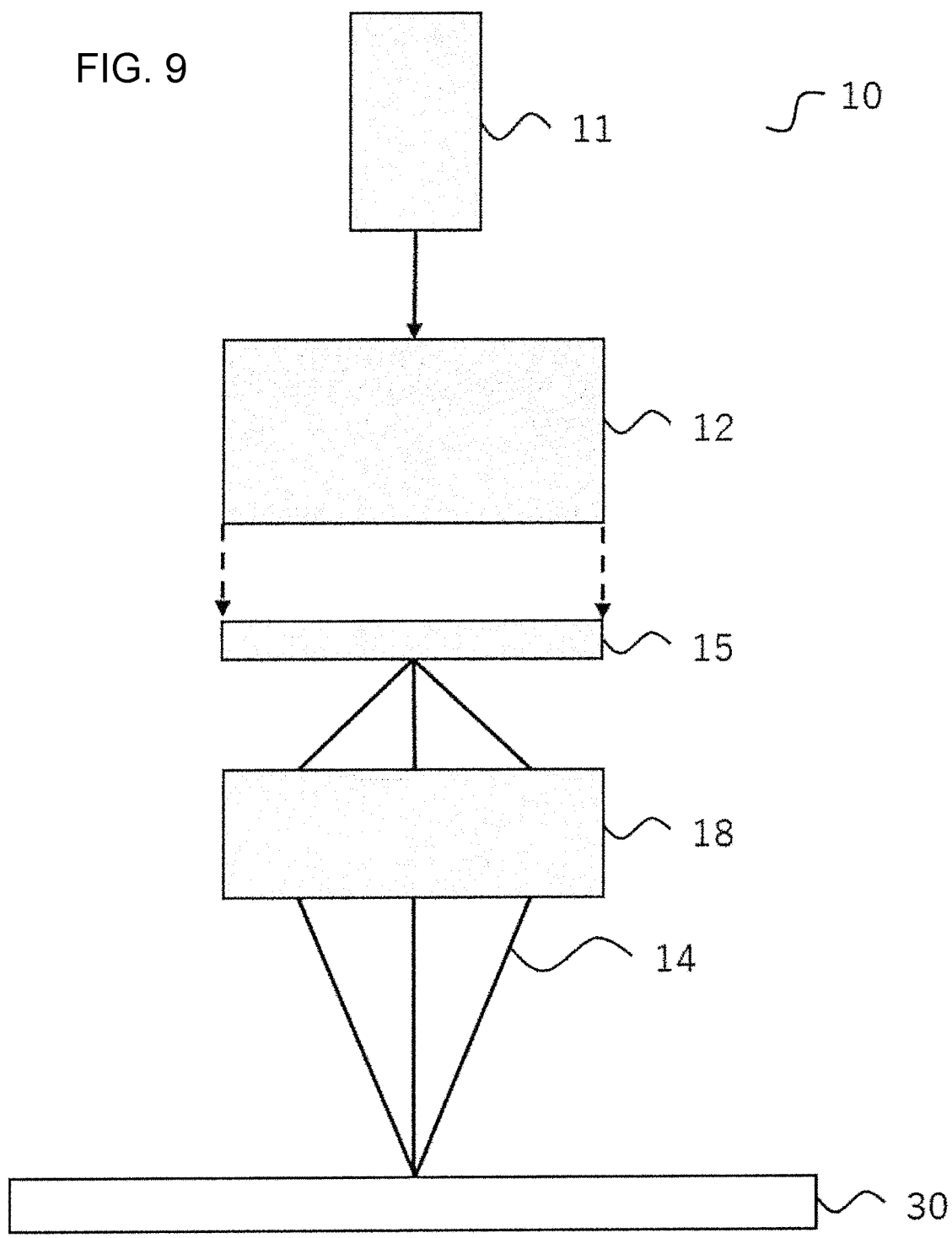
FIG. 9 is a diagram illustrating a laser beam irradiation device according to a second example.

FIG. 9 is a diagram illustrating a laser beam irradiation device 10 according to a second example. As illustrated in FIG. 9, the laser beam irradiation device 10 according to the second example includes a laser beam source 11, a coupling optical system 12, a projection mask pattern 15, and a projection lens 18. The laser beam source 11 and the coupling optical system 12 have the same configurations as the laser beam source 11 and the coupling optical system 12 in the first example illustrated in FIG. 1 and thus detailed description thereof will not be repeated.

A laser beam is transmitted by a plurality of openings (transmissive areas) of a projection mask pattern 15 (not illustrated) and applied to a predetermined area of an amorphous silicon thin film 21 by the projection lens 18.

As a result, the predetermined area of the amorphous silicon thin film 21 is instantaneously heated and melted and a part of the amorphous silicon thin film 21 becomes a polycrystalline silicon thin film 22.

When the projection lens 18 is used as in the second example, the energy density of the laser beam 14 varies depending on shots and thus the electron mobility varies depending on a plurality of polycrystalline silicon thin films 22. As described above in the first example, the electron mobility in a polycrystalline silicon thin film 22 depends on the energy density of the laser beam 14 finally applied to the polycrystalline silicon thin film 22, that is, the energy density of the final shot.

Since a plurality of polycrystalline silicon thin films 22 are formed in a thin-film transistor 20, the variations in the electron mobility between the plurality of polycrystalline silicon thin films 22 are averaged. As a result, the electron mobility between the source 23 and the drain 24 in one thin-film transistor 20 has a value obtained by averaging the variations in the electron mobility between four polycrystalline silicon thin films 22. Accordingly, in the second example, it is possible to reduce a variation in characteristics between a plurality of thin-film transistors 20 and prevent display unevenness in a liquid crystal of a liquid crystal display device.

In the second example, the laser beam irradiation device 10 emits a laser beam 14 with a predetermined cycle, moves the glass substrate 30 while no laser beam 14 is being emitted, and irradiates a part of a next amorphous silicon thin film 21 with the laser beam 14. In the second example, as illustrated in FIG. 3, the amorphous silicon thin films 21 are arranged on the glass substrate 30 at predetermined intervals "H" in the moving direction thereof. The laser beam irradiation device 10 irradiates parts of the amorphous silicon thin films 21 arranged on the glass substrate 30 with the laser beams 14 with a predetermined cycle.

When the projection lens 18 is used, a laser beam 14 is converted at the magnification of the optical system of the projection lens 18. That is, a pattern of a projection mask pattern 15 is converted at the magnification of the optical system of the projection lens 18 and a predetermined area on the glass substrate 30 is subjected to laser annealing.

Figure 10:
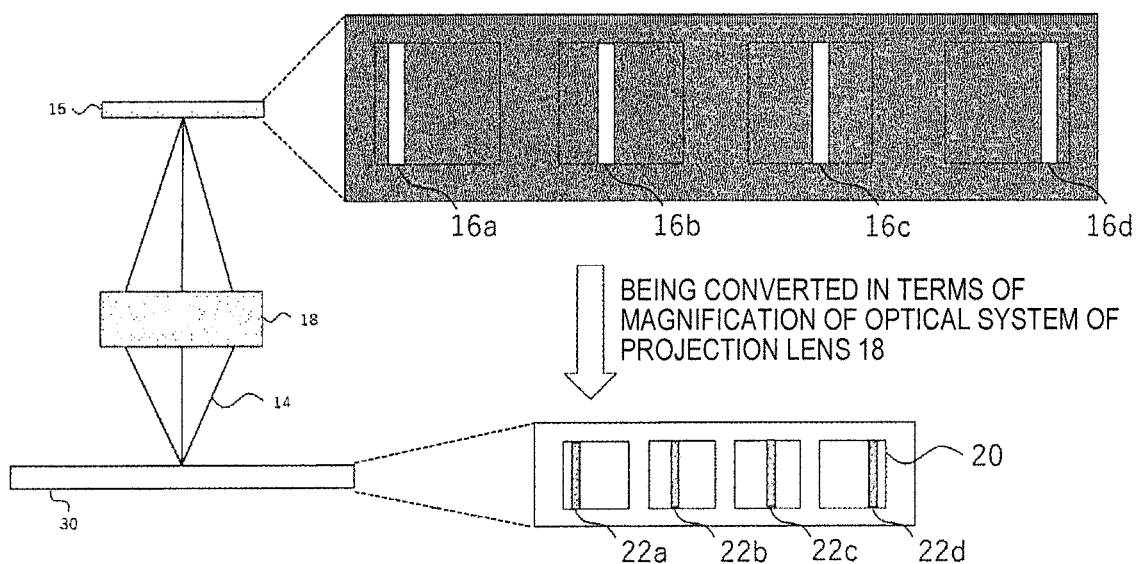
FIG. 10 is a diagram illustrating a relationship between a projection mask pattern and a thin-film transistor in the second example.

FIG. 10 is a diagram illustrating a relationship between a projection mask pattern 15 and a thin-film transistor 20 in the second example. Only a part of the projection mask pattern 15 is illustrated in FIG. 10.

As illustrated in FIG. 10, transmissive areas 16 are formed in a predetermined pattern in the projection mask pattern 15. As illustrated in FIG. 10, for example, four types of transmissive areas 16 (16a to 16d) are provided in the projection mask pattern 15. A laser beam 14 is transmitted by the transmissive area 16 of the projection mask pattern 15 and incident on the projection lens 18. That is, in the second example, the laser beam irradiation device 10 performs laser annealing on predetermined areas of a plurality of thin-film transistors 20 by one time of irradiation with a laser beam 14. In the example illustrated in FIG. 10, four types of transmissive areas 16 are provided in the projection mask pattern 15, but the number of types of the transmissive areas 16 is not limited four and a plurality of types are provided depending on the number of polycrystalline silicon thin films 22 which are formed on one thin-film transistor 20 on the glass substrate 30.

In the example illustrated in FIG. 10, different types of transmissive areas 16 (for example, the transmissive area 16a and the transmissive area 16b) are adjacent to each other, but the same type of transmissive areas 16 may be adjacent to each other. In the example illustrated in FIG. 10, a group of four types of transmissive areas 16 is included in one column (or one row) of the projection mask pattern 15, but a plurality of groups of four types of transmissive areas 16 may be included in one column (or one row). For example, four groups of the transmissive areas 16a to 16d may be included in one column (one row) of the projection mask pattern 15.

As illustrated in FIG. 10, a mask pattern of the projection mask pattern 15 is converted at the magnification of the optical system of the projection lens 18 and a predetermined area on the glass substrate 30 is subjected to laser annealing. In the example illustrated in FIG. 10, since the magnification of the optical system of the projection lens 18 is about two times, the mask pattern of the projection mask pattern 15 is about ½ (0.5) times and a predetermined area on the glass substrate 30 is subjected to laser annealing. Magnification of the optical system of the projection lens 18 is not limited to two times, but may be any magnification. The mask pattern of the projection mask pattern 15 is pursuant to the magnification of the optical system of the projection lens 18 and a predetermined area on the glass substrate 30 is subjected to laser annealing. For example, when the magnification of the optical system of the projection lens 18 is four times, the mask pattern of the projection mask pattern 15 is about ¼ (0.25) times and a predetermined area on the glass substrate 30 is subjected to laser annealing.

As illustrated in FIG. 10, the transmissive areas 16 of the projection mask pattern 15 are provided to be perpendicular to the moving direction (the scanning direction) of the glass substrate 30. The transmissive areas 16 of the projection mask patterns 15 need not necessarily be perpendicular to the moving direction (the scanning direction) of the glass substrate 30 and may be provided to be parallel (substantially parallel) to the moving direction (the scanning direction).

When the projection lens 18 forms an inverted image, a reduced image of the projection mask pattern 15 applied to the glass substrate 30 is a pattern rotating about an optical axis of a lens of the projection lens 18 by 180 degrees. On the other hand, when the projection lens 18 forms an erect image, a reduced image of the projection mask pattern 15 applied to the glass substrate 30 is the projection mask pattern 15 as it were.

In the example illustrated in FIG. 10, since the projection lens 18 forming an erect image is used, the pattern of the projection mask pattern 15 is reduced on the glass substrate 30 at it were.

A method of manufacturing a thin-film transistor 20 according to the second example using the laser beam irradiation device 10 will be described below.

In a first step, the laser beam irradiation device 10 irradiates a first area of a thin-film transistor 20 with a laser beam 14 using the mask pattern 16a of the projection mask pattern 15 and the projection lens 18. As a result, the amorphous silicon thin film 21 in the first area of the thin-film transistor 20 is instantaneously heated and melted and the polycrystalline silicon thin film 22a in FIG. 8A is formed.

Thereafter, the glass substrate 30 is moved a predetermined distance "H" while the laser beam irradiation device 10 stops irradiation with the laser beam 14.

Subsequently, in a second step, the laser beam irradiation device 10 irradiates a second area of the thin-film transistor 20 with a laser beam 14 using the mask pattern 16b of the projection mask pattern 15 and the projection lens 18. As a result, the amorphous silicon thin film 21 in the second area of the thin-film transistor 20 is instantaneously heated and melted and the polycrystalline silicon thin film 22b in FIG. 8B is formed. Thereafter, the glass substrate 30 is moved a predetermined distance "H" while the laser beam irradiation device 10 stops irradiation with the laser beam 14.

Similarly, in a third step, the laser beam irradiation device 10 irradiates a third area of the thin-film transistor 20 with a laser beam 14 using the mask pattern 16c of the projection mask pattern 15 and the projection lens 18. As a result, the amorphous silicon thin film 21 in the third area of the thin-film transistor 20 is instantaneously heated and melted and the polycrystalline silicon thin film 22c in FIG. 8C is formed. Thereafter, the glass substrate 30 is moved a predetermined distance "H" while the laser beam irradiation device 10 stops irradiation with the laser beam 14.

Subsequently, in a fourth step, the laser beam irradiation device 10 irradiates a fourth area of a thin-film transistor 20 with a laser beam 14 using the mask pattern 16d of the projection mask pattern 15 and the projection lens 18. As a result, the amorphous silicon thin film 21 in the fourth area of the thin-film transistor 20 is instantaneously heated and melted and the polycrystalline silicon thin film 22d in FIG. 8D is formed.

In this way, in the second example, a plurality of polycrystalline silicon thin films 22 are formed on a thin-film transistor 20 using the projection lens 18. As a result, the electron mobility between the source 23 and the drain 24 in each of a plurality of thin-film transistors 20 included in the glass substrate 30 has a value obtained by averaging the variations in the electron mobility. Accordingly, in the second example, since variations in characteristics between the plurality of thin-film transistors 20 are reduced, it is possible to prevent display unevenness in a liquid crystal of a liquid crystal display device.

When "vertical," "parallel," "planar," "orthogonal," and the like are mentioned in the above description, these terms do not have strict meanings. That is, "vertical," "parallel," "planar," and "orthogonal" have meanings in which tolerance or an error in design, manufacture or the like is permitted, that is, "substantially vertical," "substantially parallel," "substantially planar," and "substantially orthogonal." Tolerance or error refers to a unit within a range not departing from the configurations, operations, and advantages of our devices, transistors and methods.

When it is mentioned that the sizes or the magnitudes in appearance are "equal," "the same," "different," or the like in the above description, these terms do not have strict meanings. That is, "equal," "the same," and "different," have meanings in which tolerance or an error in design, manufacture, or the like is permitted, that is, "substantially equal," "substantially the same," and "substantially different." Tolerance or error refers to a unit within a range not departing from the configurations, operations, and advantages of our devices, transistors and methods.

While our devices, transistors and methods have been described above with reference to all the drawings and the examples, it should be noted by those skilled in the art that various modifications or corrections can be easily applied on the basis of this disclosure. Accordingly, it should be noted that these modifications or corrections are included in the scope of the appended claims. For example, functions and the like included in means, steps or the like can be rearranged unless they are conflicted, and a plurality of mans or steps may be combined into one means or step or may be divided. The configurations in the above-mentioned examples may be appropriately combined.

The invention claimed is:

1. A method of manufacturing a thin-film transistor comprising:
   a first step of forming a polycrystalline silicon thin film by irradiating a first area of an amorphous silicon thin film attached between a source electrode and a drain electrode included in a thin-film transistor with a laser beam;
   and a second step of forming the polycrystalline silicon thin film by irradiating a second area of the amorphous silicon thin film with the laser beam after irradiating the first area with the laser beam,
   wherein the second step includes irradiating the second area different from the first area in the amorphous silicon thin film with the laser beam such that the source electrode and the drain electrode are connected in parallel to each other by a plurality of amorphous silicon thin films.

2. The method according to claim 1, wherein the first step and the second step include forming the polycrystalline silicon thin film by irradiating the amorphous silicon thin film with the laser beam to perform laser annealing on the amorphous silicon thin film.

3. The method according to claim 2, wherein the first step includes irradiating the first area with the laser beam using a first microlens, and
   the second step includes irradiating the second area with the laser beam using a second microlens.

4. The method according to claim 2, wherein the first step includes irradiating the amorphous silicon thin film with the laser beam via a first projection mask in which a transmissive area corresponding to the first area is provided, and
   the second step includes irradiating the amorphous silicon thin film with the laser beam via a second projection mask in which a transmissive area corresponding to the second area is provided.

5. The method according to claim 1, wherein the first step includes irradiating the first area with the laser beam using a first microlens, and
   the second step includes irradiating the second area with the laser beam using a second microlens.

6. The method according to claim 5, wherein the first step includes irradiating the amorphous silicon thin film with the laser beam via a first projection mask in which a transmissive area corresponding to the first area is provided, and
   the second step includes irradiating the amorphous silicon thin film with the laser beam via a second projection mask in which a transmissive area corresponding to the second area is provided.

7. The method according to claim 1, wherein the first step includes irradiating the amorphous silicon thin film with the laser beam via a first projection mask in which a transmissive area corresponding to the first area is provided, and
   the second step includes irradiating the amorphous silicon thin film with the laser beam via a second projection mask in which a transmissive area corresponding to the second area is provided.

* * * * *